US006749764B1

(12) United States Patent
Siniaguine et al.

(10) Patent No.: US 6,749,764 B1
(45) Date of Patent: Jun. 15, 2004

(54) PLASMA PROCESSING COMPRISING THREE ROTATIONAL MOTIONS OF AN ARTICLE BEING PROCESSED

(75) Inventors: Oleg Siniaguine, San Jose, CA (US); Sergey Savastiouk, San Jose, CA (US); Patrick Halahan, San Mateo, CA (US); Sam Kao, San Mateo, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 575 days.

(21) Appl. No.: 09/713,137

(22) Filed: Nov. 14, 2000

(51) Int. Cl.[7] .................................................. B05C 3/00
(52) U.S. Cl. ........................ 216/67; 118/730; 204/199; 204/212; 427/481; 427/240; 156/345.55
(58) Field of Search ............................ 216/67; 118/730; 156/345.55; 204/199, 212; 901/41

(56) References Cited

U.S. PATENT DOCUMENTS

| | | | |
|---|---|---|---|
| 3,598,083 A | 8/1971 | Dort et al. .................... 118/48 |
| 3,853,091 A | 12/1974 | Christensen et al. .......... 118/49 |
| 4,315,960 A | 2/1982 | Ohji et al. .................. 427/248 |
| 4,416,760 A | 11/1983 | Turner ........................ 204/298 |
| 4,593,168 A | 6/1986 | Amada ................. 219/10.55 M |
| 5,029,555 A | * 7/1991 | Dietrich et al. ............. 118/730 |
| 5,204,145 A | 4/1993 | Gasworth ................... 427/577 |
| 5,238,532 A | 8/1993 | Zarowin et al. ............. 156/643 |
| 5,282,921 A | 2/1994 | Poultney .................... 156/626 |
| 5,291,415 A | 3/1994 | Zarowin et al. ......... 364/474.3 |
| 5,308,461 A | 5/1994 | Ahonen .................. 204/192.11 |
| 5,312,510 A | 5/1994 | Poultney .................... 156/345 |
| 5,365,031 A | 11/1994 | Mumola .................. 219/121.43 |
| 5,465,037 A | * 11/1995 | Huissoon et al. ....... 318/568.11 |
| 5,558,909 A | 9/1996 | Poliquin et al. ............ 427/251 |
| 5,665,167 A | 9/1997 | Deguchi et al. ............. 118/728 |
| 5,767,627 A | 6/1998 | Siniaguine ............. 315/111.41 |
| 5,811,021 A | 9/1998 | Zarowin et al. .............. 216/67 |
| 5,834,730 A | 11/1998 | Suzuki et al. .......... 219/121.43 |
| 5,911,760 A | * 6/1999 | Lahille et al. ............... 128/898 |
| 6,105,534 A | * 8/2000 | Siniaguine et al. ..... 118/723 EB |
| 6,139,678 A | 10/2000 | Siniaguine .................. 156/345 |
| 6,287,976 B1 | 9/2001 | Siniaguine et al. |
| 6,374,158 B1 | * 4/2002 | Fusaro, Jr. .................. 700/254 |
| 6,471,837 B1 | 10/2002 | Hans et al. |

FOREIGN PATENT DOCUMENTS

| | | |
|---|---|---|
| EP | 0 807 964 A | 11/1997 |
| JP | 59-112624 A | 6/1984 |
| JP | 60-24018 A | 2/1985 |
| JP | 01 133318 | 5/1989 |
| JP | 3-284839 A | 12/1991 |

(List continued on next page.)

OTHER PUBLICATIONS

Lieberman, Michael A. et al., "Principles of Plasma Discharges and Materials Processing" (John Wiley & Sons, New York, 1994), p. 1.

Agrikov et al., "Dynamic Plasma Treatment of HIC (Hybrid Integrated Circuit) Substrates", Elektronnaya Tehnika, Ser. 10, 5(71), 1988, pp. 30–32, with partial translation.

Primary Examiner—Allan Olsen
(74) Attorney, Agent, or Firm—Michael Shenker; MacPherson Kwok Chen & Heid LLP

(57) ABSTRACT

An article which is being processed with plasma is moved during plasma processing so that the motion of the article comprises at least a first rotational motion, a second rotational motion, and a third rotational motion which occur simultaneously. The apparatus that moves the article comprises a first arm rotatable around a first axis, a second arm rotatably attached to the first arm and rotating the article around a second axis, and a rotational mechanism for inducing a rotational motion of the article in addition to, and simultaneously with, the rotation of the first and second arms.

39 Claims, 15 Drawing Sheets

FOREIGN PATENT DOCUMENTS

| | | |
|---|---|---|
| WO | WO 92/12273 | 7/1992 |
| WO | WO 92/12610 | 7/1992 |
| WO | WO 96/21943 | 7/1996 |
| WO | WO 96/32742 | 10/1996 |
| WO | WO 97/45856 | 12/1997 |
| WO | WO 97/45857 | 12/1997 |
| WO | WO 98/19337 | 5/1998 |
| WO | WO 99/26796 | 6/1999 |
| WO | WO 99/16927 | 8/1999 |
| WO | WO 99/46805 | 9/1999 |

\* cited by examiner

PLASMA PROCESSING COMPRISING THREE ROTATIONAL MOTIONS OF AN ARTICLE BEING PROCESSED

BACKGROUND OF THE INVENTION

The present invention relates to processing of materials, and more particularly to plasma processing.

Plasma processing is widely used to modify surface properties of materials. Thus, plasma is used in fabrication of integrated circuits to perform deposition, etch, cleaning, and rapid thermal anneal. Plasma-based surface processes are also used for hardening of surgical instruments and machine tools, and are used in aerospace, automotive, steel, biomedical, and toxic waste management industries. See, for example, M. A. Lieberman and A. J. Lichtenberg. "Principles of Plasma Discharges and Materials Processing" (1994), page 1.

For some applications there are unique advantages to etching a semiconductor wafer with plasma. For example, the backsides of semiconductor wafers are sometimes etched to make the wafers thinner after the components and circuitry have been fabricated on the frontside of the wafer. The wafer can then be separated into dice. Plasma etching is used for wafer thinning because other thinning techniques (e.g., grinding) create too much stress on the wafer and may damage the wafer.

A common goal in plasma processing is high throughput and high processing uniformity.

FIG. 1 shows a prior art plasma processing system 110 described in U.S. patent application Ser. No. 08/975,403 and PCT application WO 99/26796 which are incorporated herein by reference. Plasma source 114 generates a plasma jet 120 schematically shown by an arrow. Carrousel 124 has five wafer holders 130 (or some other number of wafer holders) each of which holds a semiconductor wafer. The wafers, not shown in FIG. 1, are positioned beneath the holders 130. Plasma jet 120 flows upwards and impinges on the wafers bottom surfaces. Holders 130 may be non-contact vortex holders (these holders do not contact the wafers top surface), or they may be contact holders that hold the wafers by vacuum or by electrostatic or mechanical means.

Plasma processing occurs at atmospheric pressure. Plasma jet 120 is too narrow to cover an entire wafer, so the wafers are moved in and out of the plasma in a predetermined pattern aimed at achieving uniform processing. Each holder 130 is rigidly attached to a respective arm 140A of an angle drive 140. Angle drive 140 rotates the wafers around a vertical axis 140X. Angle drive 140 has a body 140B rigidly attached to an arm 150A of an angle drive 150. Drive 150 rotates the arm around a vertical axis 150X. Control system 154 (e.g. a computer) controls the drives 140 and 150.

Plan view FIGS. 2A–2C illustrate the wafer path. Only one wafer 134 is shown for simplicity. For each position of arm 150A, wafers 134 sweep through a ring-shaped (donut-shaped) path 202 centered at axis 140X. The actual path swept by the wafers is not a ring since drive 150 is not stationary, but a ring is a fair approximation of the wafer path if angular velocity W1 of drive 150 is several times smaller than angular velocity W2 of drive 140.

Numeral 220 denotes a stationary horizontal line that intersects the axis 150X and the center of plasma jet 120. Angle Θ is the angle between the line 220 and the arm 150A.

In FIG. 2A. Θ=0. Axis 140X is in its farthest position from plasma 120. The arms 140A, 150A, and the distance between the center of plasma 120 and the axis 150X, are dimensioned so that at Θ=0 the wafers do not pass over the plasma. This eliminates plasma processing during wafer loading and unloading. (Wafer loading and unloading occur at Θ=0.)

In the example of FIGS. 2A, 2B, 2C, arm 150A rotates clockwise. In FIG. 2B, the angle Θ has increased to some value Θ1, and the outer edge 134F of wafer 134 has entered the plasma 120. (The "outer edge" refers to the most distant edge from axis 140X.) As Θ continues to increase, the plasma processes wafer points closer and closer to axis 140X. In FIG. 2C, the plasma processes the wafer edge 134C closest to axis 140X (Θ is some value Θ2). When angle Θ is 180°, no plasma processing takes place.

As Θ increases from 180° to 360°, the wafer path 202 returns to its position in FIG. 2A via a symmetric route. For each value $\Theta_o$ between 180° and 360°, the positions of ring 202 for $\Theta=\Theta_o$ and $\Theta=360°-\Theta_o$ are symmetric to each other relative to line 220.

An advantage of the system of FIG. 1 is that there is no need to move the plasma source 114. (In some earlier systems, a single wafer was positioned at the location of axis 140X; the plasma source had to move towards and away from the axis 150X to process the whole wafer.)

To achieve uniform processing, the system of FIG. 1 attempts to make each point on the wafer pass through the plasma the same number of times and spend the same amount of time in the plasma. The velocity W1 of drive 150 varies so that the wafer points located farther from axis 140X spend about the same time in the plasma as the points closer to the axis 140X. The wafer passes multiple times over the plasma during each revolution of drive 150. The paths traced by the plasma on the wafer surface in consecutive revolutions of drive 140 overlap. The overlap is particularly desirable because the plasma jet 120 may have non-uniform heat distribution across the jet's horizontal cross section.

It is desirable to further improve processing uniformity while maintaining high processing throughput.

SUMMARY

In the system of FIG. 1, processing uniformity may suffer at the wafer edges due to unstable plasma behavior when the wafer enters and exits the plasma. Another reason why the processing uniformity may suffer is as follows. As the wafer moves through the plasma, the processing byproducts are generated at the bottom surface of the wafer. These byproducts may impede the wafer processing near the wafer edge exiting the plasma.

To improve the processing uniformity, one can change the direction of the W2 rotation during processing. This solution is described in U.S. patent application Ser. No. 09/315,122 filed May 19, 1999 by O. Siniaguine et al. and incorporated herein by reference. Disadvantageously, changing the direction of the W2 rotation tends to increase the processing time. It is therefore desirable not to change the direction of the W2 rotation, or at least to reduce the number of times that the direction of the W2 rotation is changed.

Another problem noted in the U.S. patent application Ser. No. 09/315,122 relates to different cooling times obtained for the wafer points at different distances from the axis 140X of drive 140. As illustrated in FIGS. 2A, 2B, and 2C, the entire wafer is processed during each half-revolution of drive 150. The wafer is processed once when θ changes from 0 to 180°, and once when θ changes from 180° to 360°. Each point P on the wafer's bottom surface is processed when θ is at or near some value $\theta_P$. When $\theta$ increases past the value $\theta_P$, the point P is moved out of the plasma and is therefore cooled. The point P does not re-enter the plasma until $\theta$ reaches the value $360°-\theta_P$ in the next half-revolution of drive 150. Then the point P becomes processed again, and then is cooled again until the angle $\theta$ becomes equal to $\theta_P$.

As shown in the U.S. patent application Ser. No. 09/315,122, the cooling times may be different for different points on the wafer. To equalize the cooling times, U.S. patent application Ser. No. 09/315,122 proposes to suppress plasma processing during one half of each revolution of drive 150. For example, plasma processing could take place only when $\theta$ changes from 0° to 180°, or only when $\theta$ changes from 180° to 360°. Disadvantageously, suppressing the plasma processing during one half of each revolution tends to increase processing time.

In some embodiments of the present invention, the wafer is subjected to a third rotation in addition to the rotation of drives 140 and 150. For example, the wafer can be rotated around its axis, or some other axis, simultaneously with being rotated by drives 140 and 150. The processing uniformity is improved because the processing byproducts affect the wafer processing more uniformly across the surface of the wafer. In addition, the cooling times for different points on the wafer surface also become more uniform. These advantages can be achieved without suppressing the wafer processing during one half of each revolution of drive 150, and without changing the direction of rotation of drive 140. The throughput is therefore increased. However, the direction of rotation may be changed, and the wafer processing may be suppressed during one half of each revolution of drive 150, if desired.

Another advantage obtained in some embodiments of the present invention is illustrated in FIGS. 3, 4. As shown in FIG. 3, each path 120P traced by the plasma on the wafer surface in the system of FIG. 1 during a single revolution of drive 140 is approximately an arc with a center at axis 140X. The path approximates the arc because the velocity W2 is greater than W1. If the plasma processing is temperature sensitive (a temperature sensitive etch, for example) the processed wafer may have grooves and ridges extending in the direction of arcs 120P.

In some embodiments of the present invention, the third wafer rotation causes the plasma paths on the wafer to become more varied (FIG. 4). The processing uniformity is therefore improved.

The invention is not limited to the embodiments described above. Some embodiments provide a method for processing an article with plasma, the method comprising:
(a) generating the plasma;
(b) moving the article as the article contacts the plasma, wherein a motion of the article comprises at least a first rotational motion, a second rotational motion, and a third rotational motion which occur simultaneously.

Some embodiments provide an apparatus for moving an article through plasma, the apparatus comprising:
a first arm rotatable around a first axis;
a second arm rotatably attached to the first arm to rotate an article around a second axis; and
a rotational mechanism for inducing a rotational motion of the article in addition to, and simultaneously with, the rotation of the first and second arms.

Some embodiments provide articles processed by methods of the present invention.

Other features and advantages of the invention are described below.

DESCRIPTION OF PREFERRED EMBODIMENTS

Figure 5:
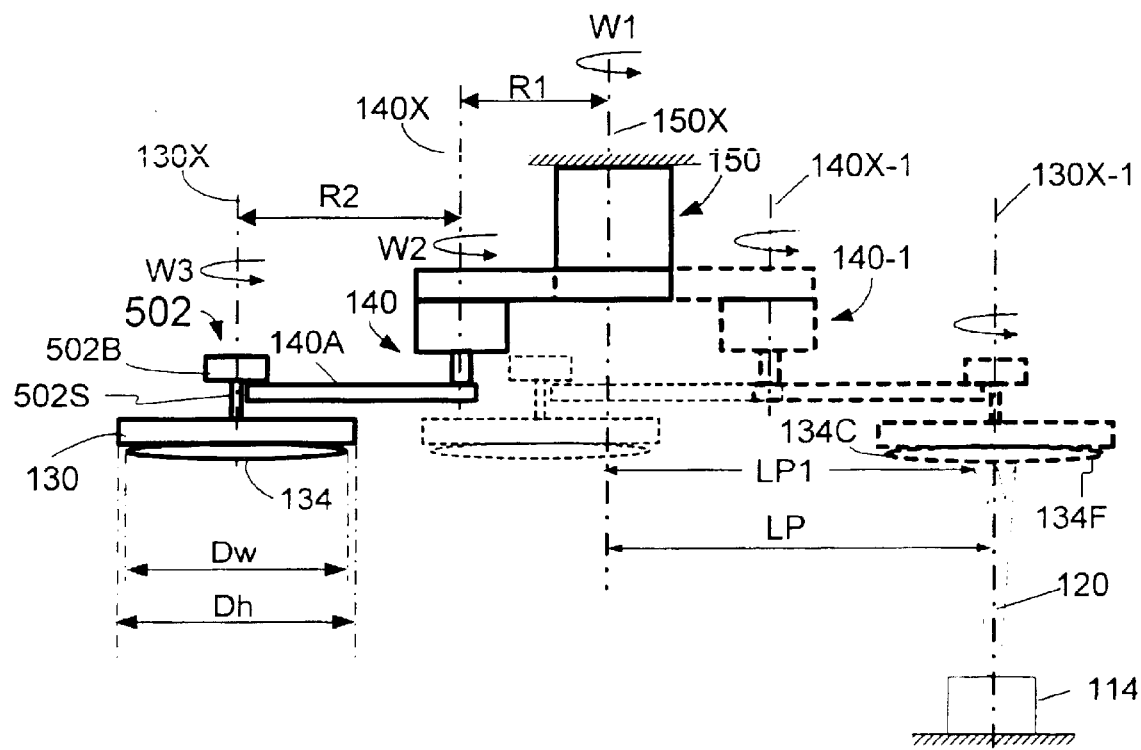
FIGS. 5–7 are side views of plasma processing systems according to some embodiments of the present invention.

FIG. 5 illustrates a plasma processing system in which each wafer 134 rotates around axis 130X of respective wafer holder 130. Only one wafer is shown, though any number of wafers may be present. Wafer holders 130 are contact holders (for example, vacuum, electrostatic or mechanical chucks). Each wafer holder 130 is rotated by a respective angle drive 502. Drive 502 has a body 502B rigidly attached to and 140A of drive 140. A motor (not shown) inside the body 150B rotates a spindle 502S rigidly attached to holder 130. As a result, the holder 130 rotates around some vertical axis 130X defined by drive 502. The angular velocity is shown as W3. The bottom surface of holder 130 may have a circular portion designed to receive the wafer 134. In some embodiments, the axis 130X passes through the center of that portion. Axis 130X may pass through the center of mass of the wafer or the wafer holder or both.

Other arrangements of drive 502 relative to the holder are also possible. For example, transmission can be used to transfer the motion from the drive's motor to the holder. The motor can be a stepper motor or any other kind of motor, known or to be invented.

Figure 1:
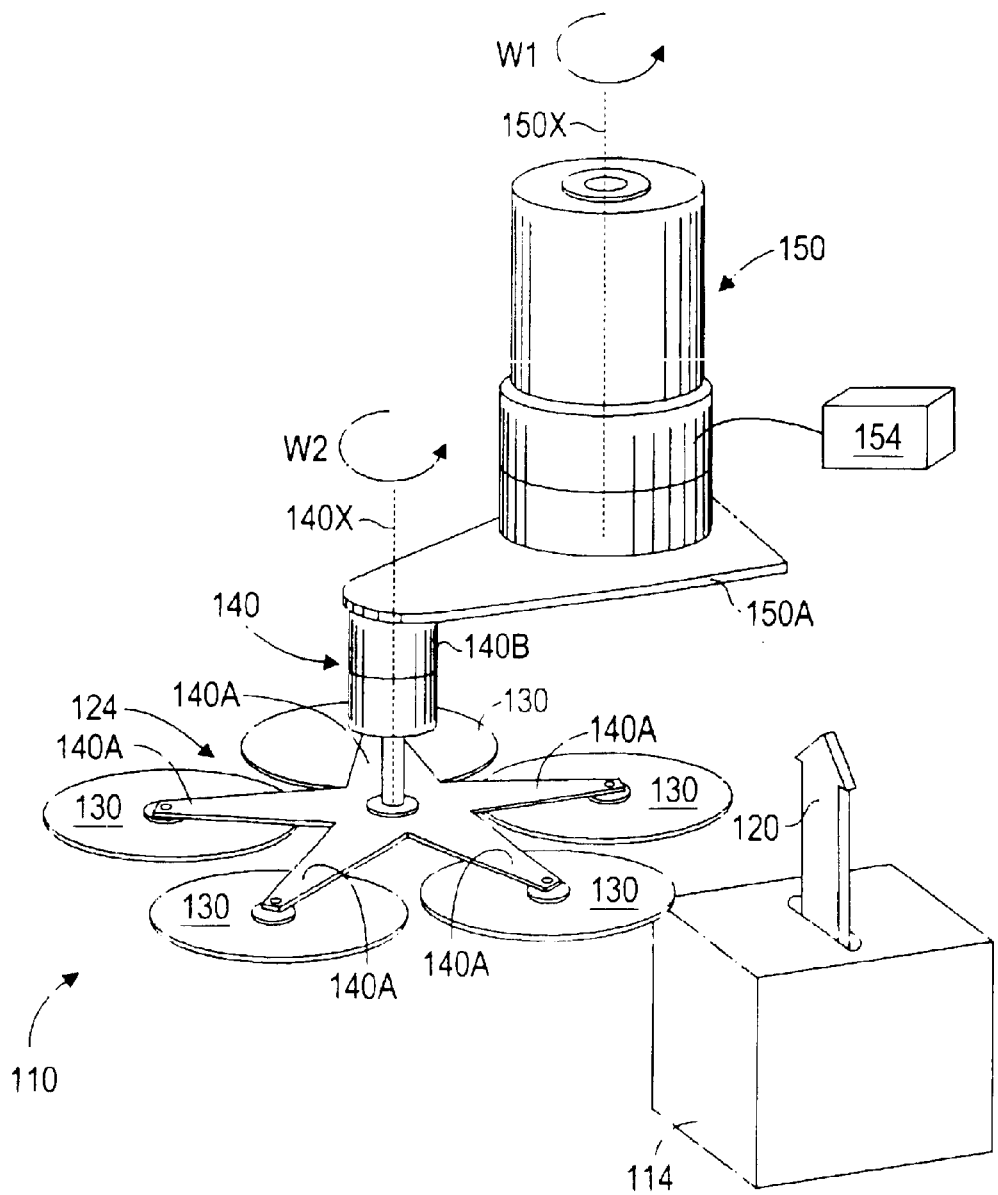
FIG. 1 shows a prior art plasma processing system.
Figure 2A:
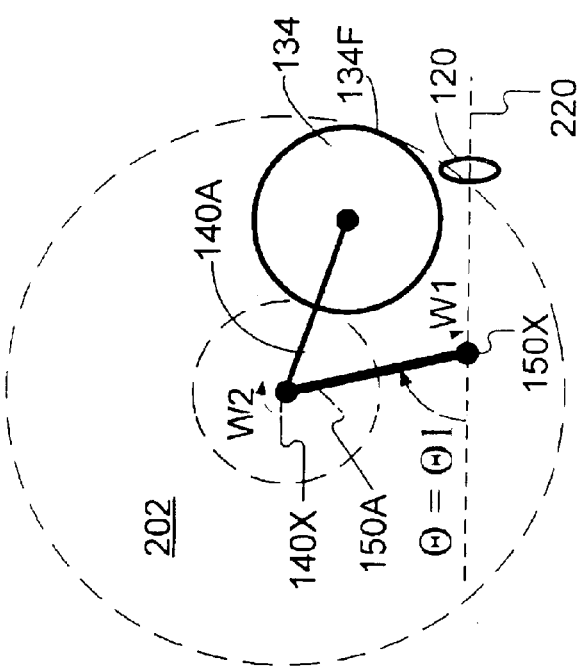
FIGS. 2A, 2B, 2C illustrate wafer trajectories in the system of FIG. 1.
Figure 2B:
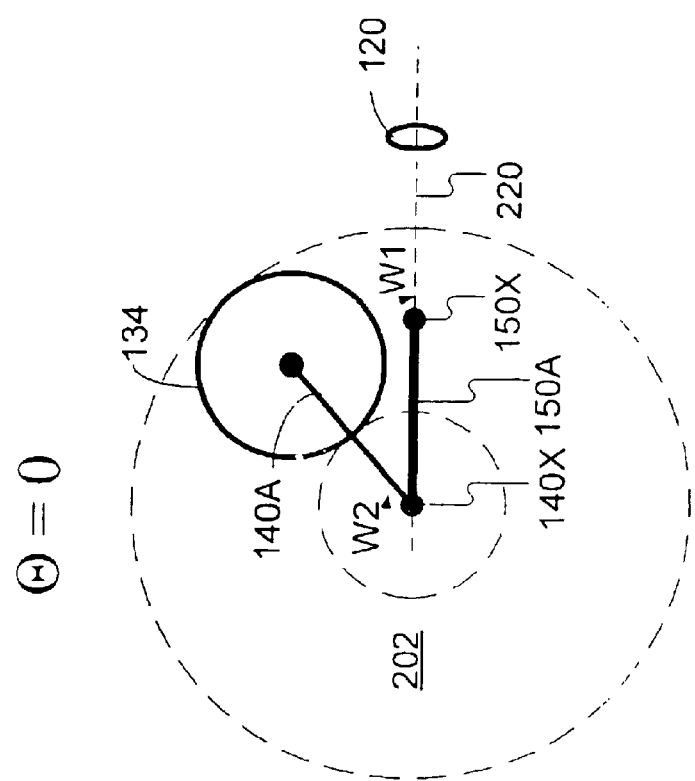
Figure 2C:
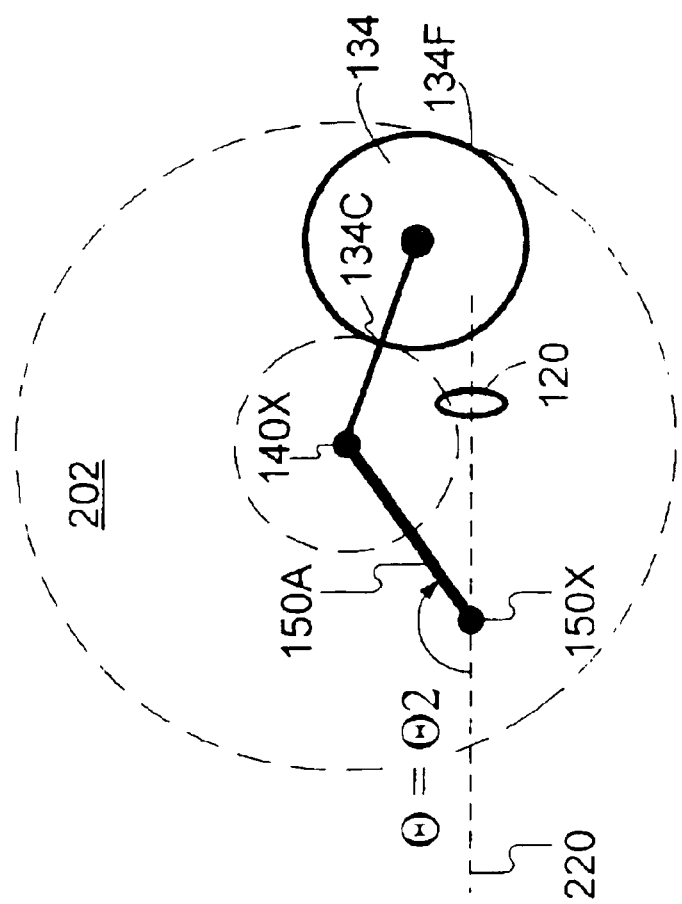
Figure 3:
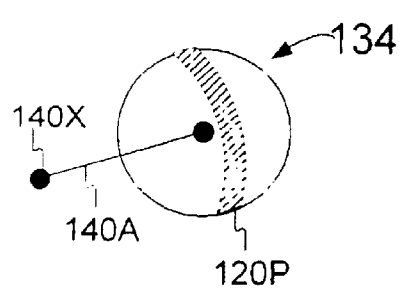
FIG. 3 is a bottom view illustrating a plasma path on the wafer in the system of FIG. 1.
Figure 4:
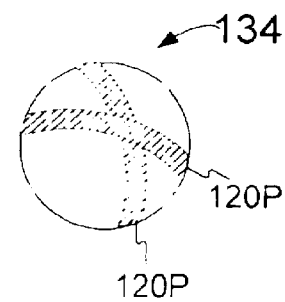
FIG. 4 is a bottom view illustrating plasma paths on the wafer in one embodiment of the present invention.

Drives 150 and 140 are arranged as in FIG. 1. Drive 140 is shown at position $\Theta=0$ (as in FIG. 2A). Numeral 140-1 indicates the position of drive 140 at Θ=180°. Numberals 140X-1 and 130X-1 indicate respectively the positions of axes 140X and 130X at Θ=180°.

Except for the addition of drives 502, the system can be identical to the system of FIG. 1. The embodiment of FIG. 5 is different, however, with respect to position of plasma source 114 relative to the wafers. At Θ=180°, the wafer edge 134C closest to axis 140X does not pass over the plasma. Rather, the plasma processes the wafer points near the center of the wafer (at axis 130X-1). Thus, the plasma source is farther from the rest of the system than in FIG. 1.

The wafer portion close to axis 140X will be processed when this portion will be rotated by drive 502 to a position farther from axis 140X.

This plasma positioning provides better wafer cooling. The wafer points close to axis 140X have lower speeds and hence are not cooled as well as the wafer points farther from the axis 140X. (We define "speed" as the magnitude of a linear velocity.) It is therefore desirable in temperature sensitive processing not to process the wafer points close to the axis 140X in order to avoid overprocessing of these points. Also, the plasma is farther from drives 140, 150, and from the wafer holders, so these parts are not heated as much.

In some embodiments, the angular velocity W1 of drive 150 is such that drive 150 makes one revolution in a time period of 2 to 30 seconds. The angular velocity W2 is 60 to 300 revolutions per minute. The angular velocity W3 of wafer 134 is 0.1 to 3 revolutions per minute. In some embodiments, the wafer makes at least 3 to 5 W3 revolutions during plasma processing.

In some embodiments, the velocity W2 is constant. The wafer points farther from axis 140X (such as point 134F) move faster through the plasma than the wafer points closer to axis 140X (such as point 134C). The velocity W1 is varied to compensate for this difference. When the plasma processes the wafer points farther from the axis 140X, the velocity W1 is lower than when the plasma processes wafer points closer to axis 140X. Some W1 patterns are described in U.S. patent application Ser. No. 09/315,122 filed on May 19, 1999, incorporated herein by reference.

The velocities W1, W2, W3 can be controlled to achieve suitable heating and cooling cycles for plasma processing at atmosphere pressure. Such plasma processing is described in the U.S. patent application Ser. No. 09/315,122.

The present invention is not limited to any particular velocity values or relationships between velocities W1, W2, W3. The invention is not limited to the position of plasma source 114. In some embodiments, the plasma source is positioned as in FIG. 1.

In FIG. 5, R1 denotes the distance between the axes 150X and 140X. R2 is the distance between the axes 140X and 130X. In some embodiments with multiple wafer holders, the axes of all wafer holders 130 are at the same distance R2 from axis 140X. Dw is the wafer diameter. Dh is the diameter of wafer holder 130, (which is substantially round). LP is the distance between the axis 150X and the center of plasma jet 120. LP1 is the distance between the axis 150X and the closest point of plasma 120 in the plane passing through the bottom surface of the wafer. (LP1 may vary during the wafer processing as the wafer gets thicker or thinner.)

In some embodiments, the following equation holds true:

$$LP \leq R1+R2+Dw/2 \quad (1)$$

This equation means that at Θ=180° the wafer center is over the center of plasma jet 120 or to the right of the center of the plasma jet.

In some embodiments:

$$LP \leq R1+R2 \quad (2)$$

This equation means that at Θ=180° the wafer edge 134F farthest from axis 140X is over the center of the plasma jet 120 or to the right of the center of the plasma jet.

In some embodiments:

$$LP1 > R2-R1+Dw/2 \quad (3)$$

This means that at Θ=0, the wafers do not pass over the plasma. Therefore, plasma processing during loading and unloading is avoided if the loading and unloading are performed at Θ=0. Moreover, in some embodiments:

$$LP1 > R2-R1+Dh/2 \quad (4)$$

This means that during loading and unloading the wafer holders do not pass over the plasma. Therefore, heating of the wafer holders is reduced.

In those embodiments in which a wafer edge 134C can be processed with plasma:

$$LP1 \leq R1+R2-Dw \quad (5)$$

Figure 6:
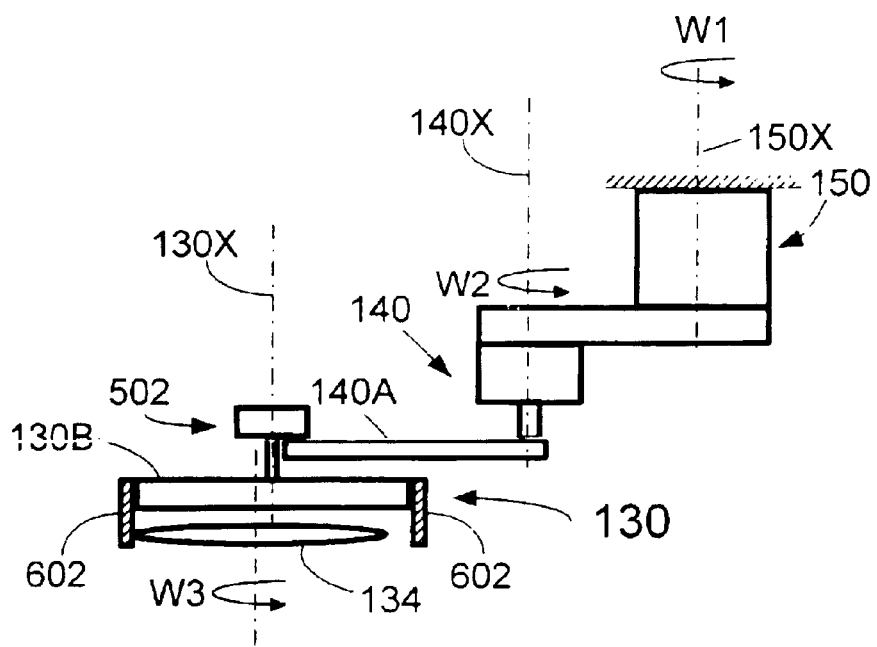

In FIG. 6, wafer holders 130 are non-contact vortex or Bernoulli holders. In a vortex holder, one or more gas vortices are emitted from the holder's body 130B towards the wafer. A vacuum near the center of each vortex holds the wafer adjacent to the holder. Escaping gas also prevents the wafer from contacting the body of the holder. Suitable holders are described in the following U.S. Patent Applications, incorporated herein by reference: application Ser. No. 09/457,042, filed Dec. 7, 1999, entitled "Brim And Gas Escape For Non-Contact Water Holder": application Ser. No. 09/456,135, filed Dec. 7, 1999, entitled "Non-Contact Workpiece Holder": application Ser. No. 09/038,642, filed Mar. 10, 1998, entitled "Holders Suitable To Hold Articles During Processing And Article Processing Methods". See also PCT application published as number WO 99/46805 on Sep. 16, 1999, incorporated herein by reference. Other vortex holders, and non-contact Bernoulli holders, can also be used.

The holder of FIG. 6 is provided with a limiter 602 rigidly attached to holder body 130B rotated by drive 502. Limiter 602 can be a continuous rim surrounding the wafer 134. Alternatively, limiter 602 can be a number of discrete pins surrounding the wafer. The wafer is pressed against the limiter 602 by the centrifugal force developed by the W2 rotation of the wafer around the axis 140X. The friction between the limiter 602 and the wafer 134 causes the wafer to rotate with the wafer holder. The wafer rotates around an axis 134X.

Axis 134X is not necessarily stationary relative to wafer holder 130. If wafer 134 is perfectly round, and the axis 134X passes through the center of the wafer, the axis 134X may be stationary relative to holder 130. However, a semiconductor wafer may have a "flat", that is, a linear boundary portion. In that case, the axis 134X will not be stationary. The axis 134X may be any vertical axis passing through the wafer.

In FIGS. 5 and 6, the rotations W1, W2, W3 may be in the same direction (for example, all clockwise or counterclockwise) or in different directions in any combination (for example, rotations W1, W2 may be clockwise and W3 may be counterclockwise). The direction of rotation can be changed during plasma processing.

Figure 7:
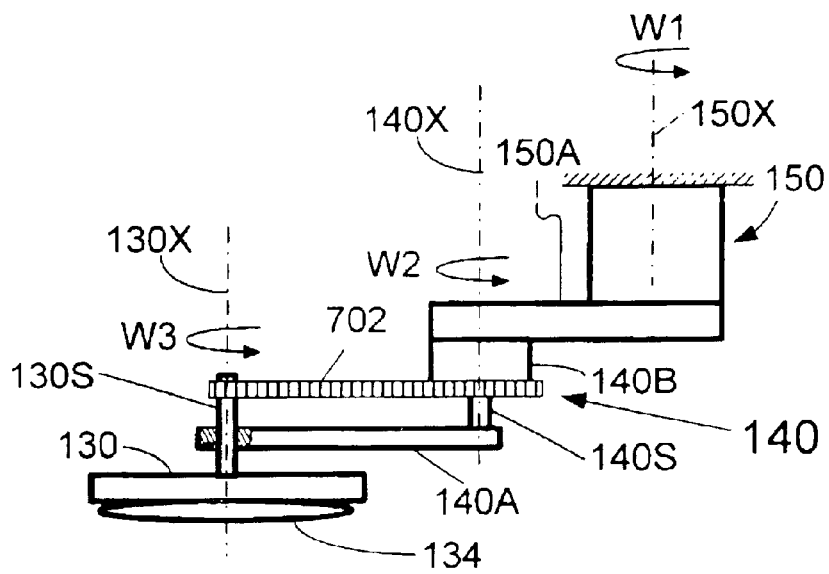

In FIG. 7, the W3 rotation of the wafer holder 130 is actuated by drive 140. The drive's motor (not shown) rotates a spindle 140S rigidly attached to arm 140A, as in FIGS. 5 and 6. The drive's cylindrical body 140B does not rotate around axis 140X, and is stationary relative to arm 150A. A link 702, for example a belt or a chain, runs around the cylindrical surface of body 140B and also runs around a spindle 130S rigidly attached to wafer holder 130. Spindle 130S passes through a slot in arm 140A. Spindle 130S can rotate freely around its axis 130X. The rotation around the axis 140X causes the spindle 130S to drive the link 702 around the body 140B. The body 140B rolls along the inner surface of link 702 without slippage (although some slippage is admissible). This causes the link 702 to travel around the spindle 130S. The link 702 travels around the spindle 130S without slippage (although some slippage is admissible), causing the spindle to rotate.

The velocity W3 is determined by the velocity W2 and by the diameters of the cylindrical surfaces of body 140B and spindle 130S. The velocity W3 can be changed by a transmission mechanism using known techniques.

Figure 8:
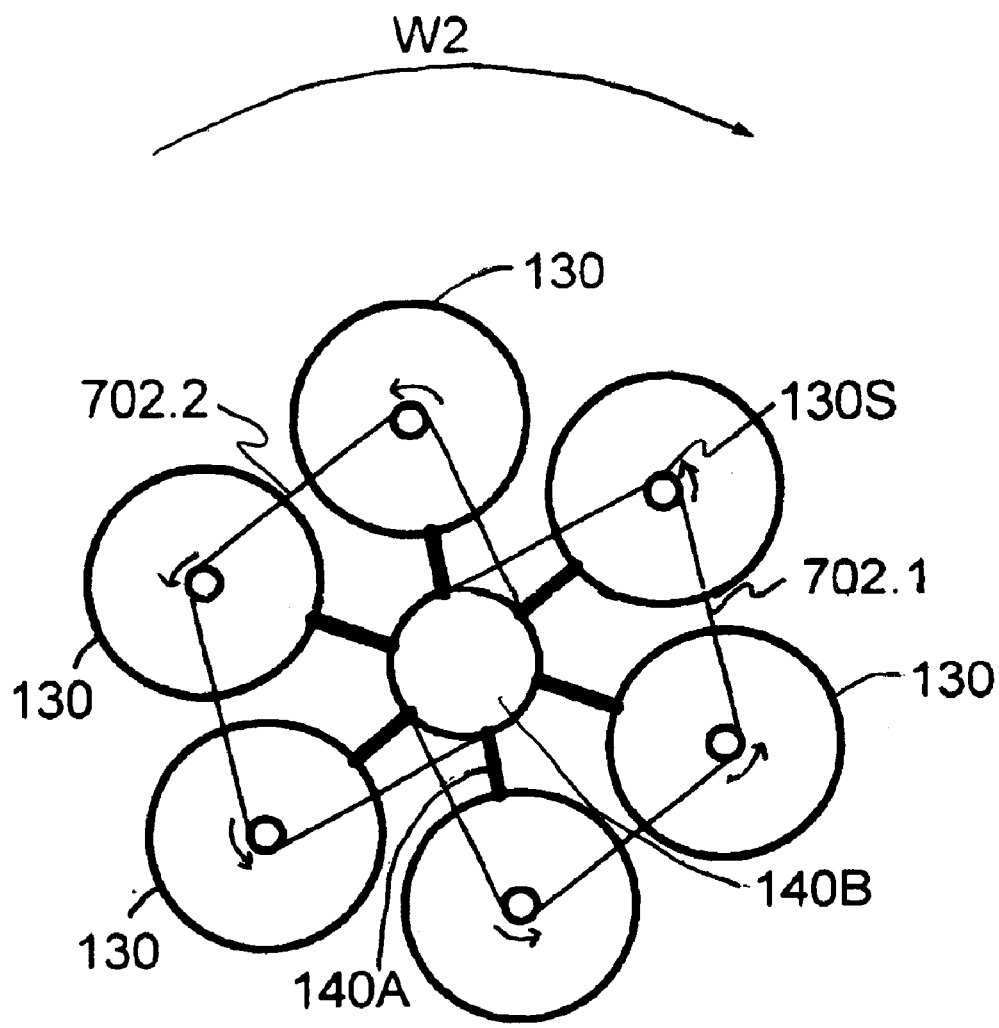
FIG. 8 is a top view illustrating some features of one embodiment of the present invention.

If multiple wafer holders are used, a separate link 702 can be provided for each wafer holder. Alternatively, one link can be shared by a number of wafer holders. In FIG. 8, six wafer holders are shown. A link 702.1, e.g. a belt or a chain, rotates three of the wafer holders, and link 702.2 rotates the other three of the wafer holders. Links 702.1, 702.2 are positioned at different heights. The W2 rotation is clockwise. The spindles 130S rotate counterclockwise around their respective axes.

The vertical axis of each spindle 130S may pass through the center of holder 130 or wafer 134 or both, or through the center of mass of holder 130 or wafer 134 or both.

In FIGS. 7 and 8, links 702 can be replaced by other suitable mechanisms to transfer the rotation of arm 140A around axis 140X to the rotation of spindles 130S around their respective axes. For example, a gear train can be used, with a gear or gears mounted on body 140B and a gear mounted on each spindle 130S. Combinations of gears, belts, chains, ropes, and other members, known or to be invented, can also be used. In some embodiments, a magnetic field is used to rotate the spindles. A magnetic member (not shown) is mounted on body 140B. The magnetic member has areas of alternating magnetic polarities along the circumference of body 140B. A similar magnetic member (not shown) is mounted on each spindle 130S. Rotation of arm 140A changes the position of the magnetic field relative to body 140B and spindles 130, and the changing field causes the spindles 130S to rotate. Other mechanisms, know or to be invented, can also be used.

Wafer holders 130 of FIGS. 7 and 8 can be non-contact holders, as in FIG. 6. A mechanism 702 can be used to drive the rim 602 rigidly attached to the body of the holder.

Figure 9:
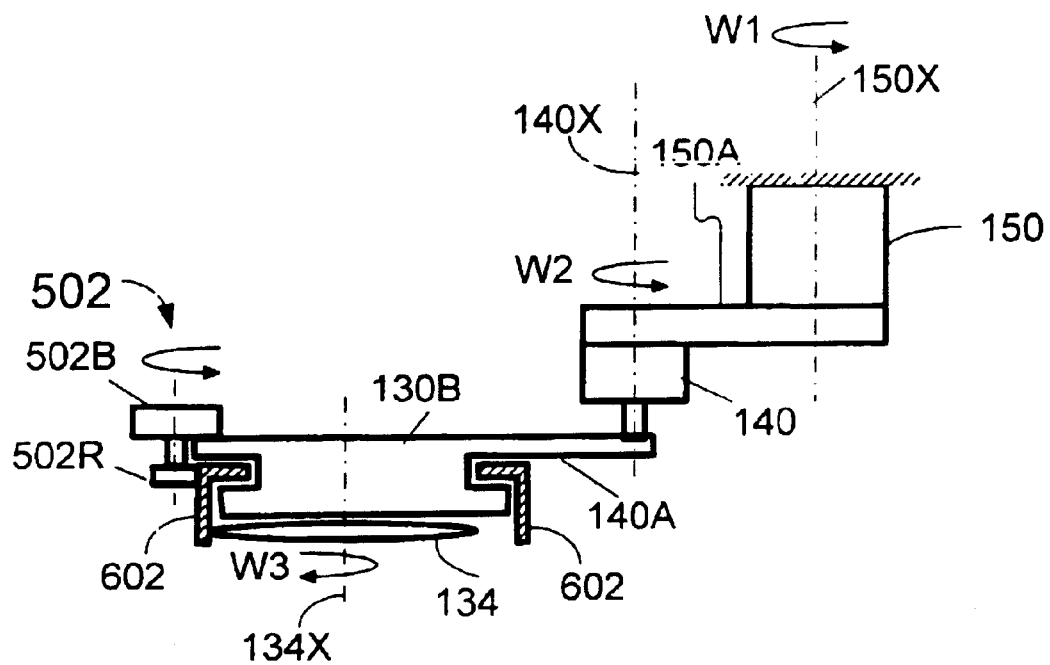
FIG. 9 is a side view of a plasma processing system in one embodiment of the present invention.

In FIG. 9, the wafer holder 130 is also a non-contact holder, but its rim 602 can rotate freely around the holder's body 130B. The holder's body 130B is rigidly attached to arm 140A. Angle drive 502 has a body 502B rigidly attached to the wafer holder body 130B. A motor (not shown) inside the body 502B rotates a bobbin 502R around a vertical axis. This rotation is transferred to rim 602 by direct coupling (as in FIG. 9) or through a transmission. The outer edge of the wafer is pressed against the rim 602, so the wafer rotates around an axis 134X.

The invention is not limited to any particular positioning of drive 502 or other drives in FIG. 9 or in other figures. For example, the bobbin 502R may contact the rim 602 from inside the rim. The rim may extend above the body 130B. Other arrangements may also be possible.

Figure 10:
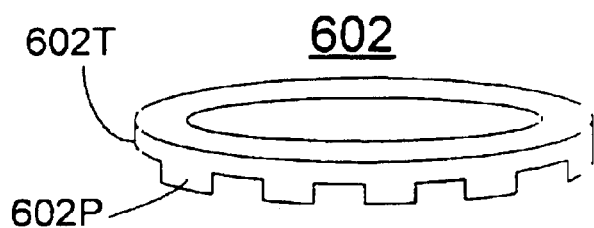
FIG. 10 is a perspective view of a rim of a wafer holder in one embodiment of the present invention.

Rim 602 may be a continuous rim. Alternatively, as shown in FIG. 10, the top portion 602T of the rim may be continuous, and the bottom portion 602P may be made in the form of protrusions or pins. The top portion contacts the bobbin 502R. The bottom portion contacts the wafer 134. The top portion may be provided with additional openings to make it easier for the gas holding the wafer to escape.

Figure 11:
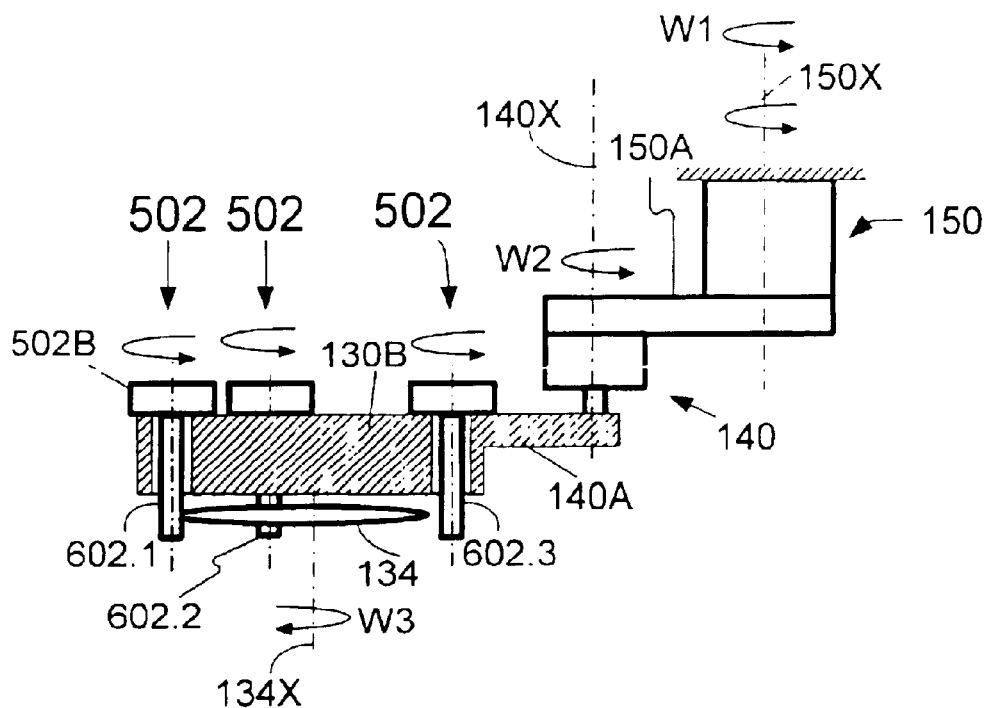
FIG. 11 is a side view of a plasma processing system of one embodiment of the present invention.

FIG. 11 shows another system using non-contact wafer holders. Here the limiters 602.1, 602.2, 602.3 are individual pins. Each pin is rotated by its own angle drive 502 having a body 520B rigidly attached to the holder's body 130B. All the pins rotate in the same direction. In FIG. 11, three pins are shown. Any number of pins can be provided. The wafer contacts only a pin or pins positioned on the outside of the holder, that is, the pin or pins farthest from the axis 140X. In some other embodiments, only these pins rotate. The remaining pins, such as pin 602.3 in FIG. 11, are provided to restrain the wafer during loading and unloading. During loading and unloading, the W3 rotation of the wafer is not needed. Therefore, in some embodiments, pin 602.3 is rigidly affixed to the holder body 130B. In other embodiments, pin 602.3 is freely rotatable, but is not driven. Allowing all the pins to rotate, and providing them drives, is believed to be beneficial for uniform, controllable W3 rotation of the wafer during plasma processing, because the wafer may accidentally touch the inner pins (such as pin 602.3) during the plasma processing.

Figure 12:
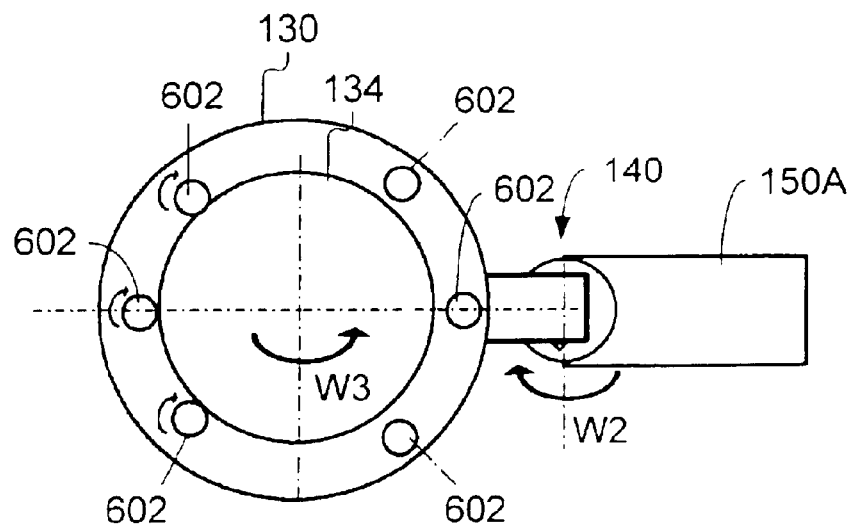
FIG. 12 is a bottom view of a wafer holder in some embodiments of the present invention.

FIG. 12 shows a bottom view of a wafer holder, with three rotatable pins 602 and three non-rotable pins.

Figure 13:
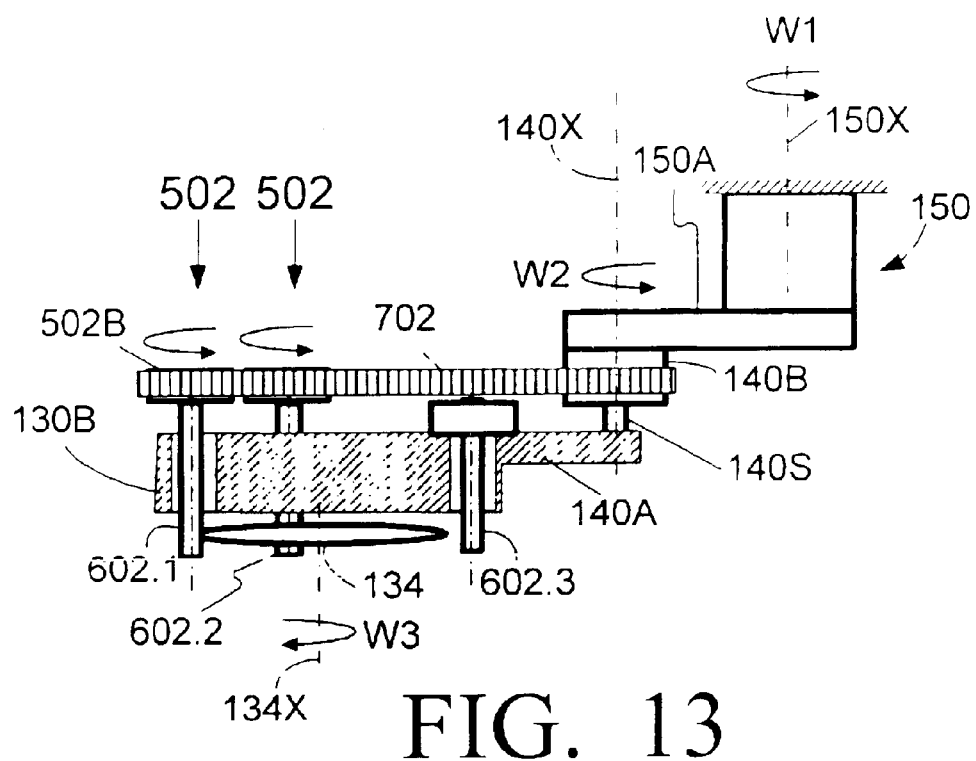
FIG. 13 is a side view of a plasma processing system in one embodiment of the present invention.

In FIG. 13, the pins 602.1, 602.2 are rotated using the energy of drive 140, in a way similar to that of FIG. 7. A single link 702, e.g. a belt or a chain, may be used to rotate a number of pins on a single holder (two pins in FIG. 13). Other types of mechanisms can also be used. A transmission can be used to adjust the velocity of the pin rotation. All the pins driven by mechanisms 702 rotate in the same direction.

Pin 602.3 is freely rotatable but is not driven.

Figure 14:
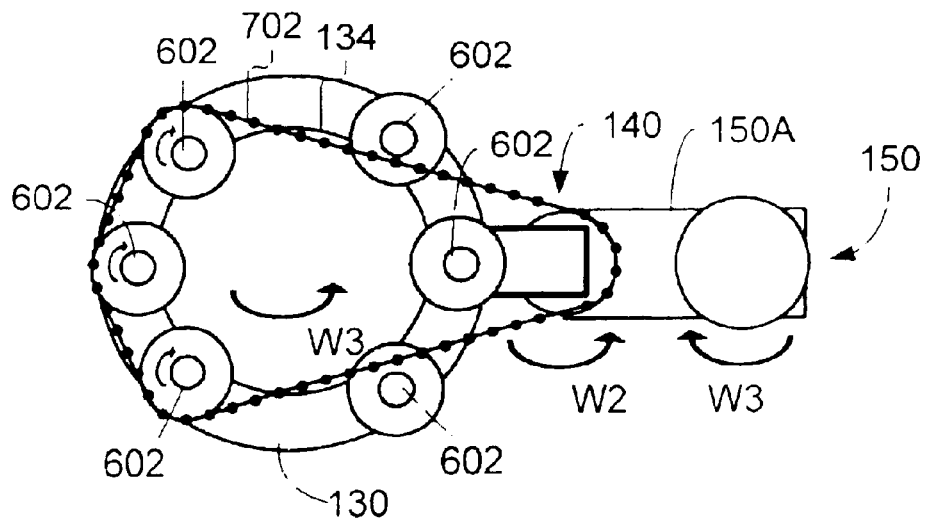
FIGS. 14 and 15 are bottom views of wafer holders in some embodiments of the present invention.

In FIG. 14, a link 702, e.g. a belt or a chain, drives three of the six pins 602 of holder 130. (Other mechanisms can also be used instead of a single link.) The other three pins are not driven. Some of these three pins may be freely rotatable, while others may be rigidly affixed to the body of the holder.

Figure 15:
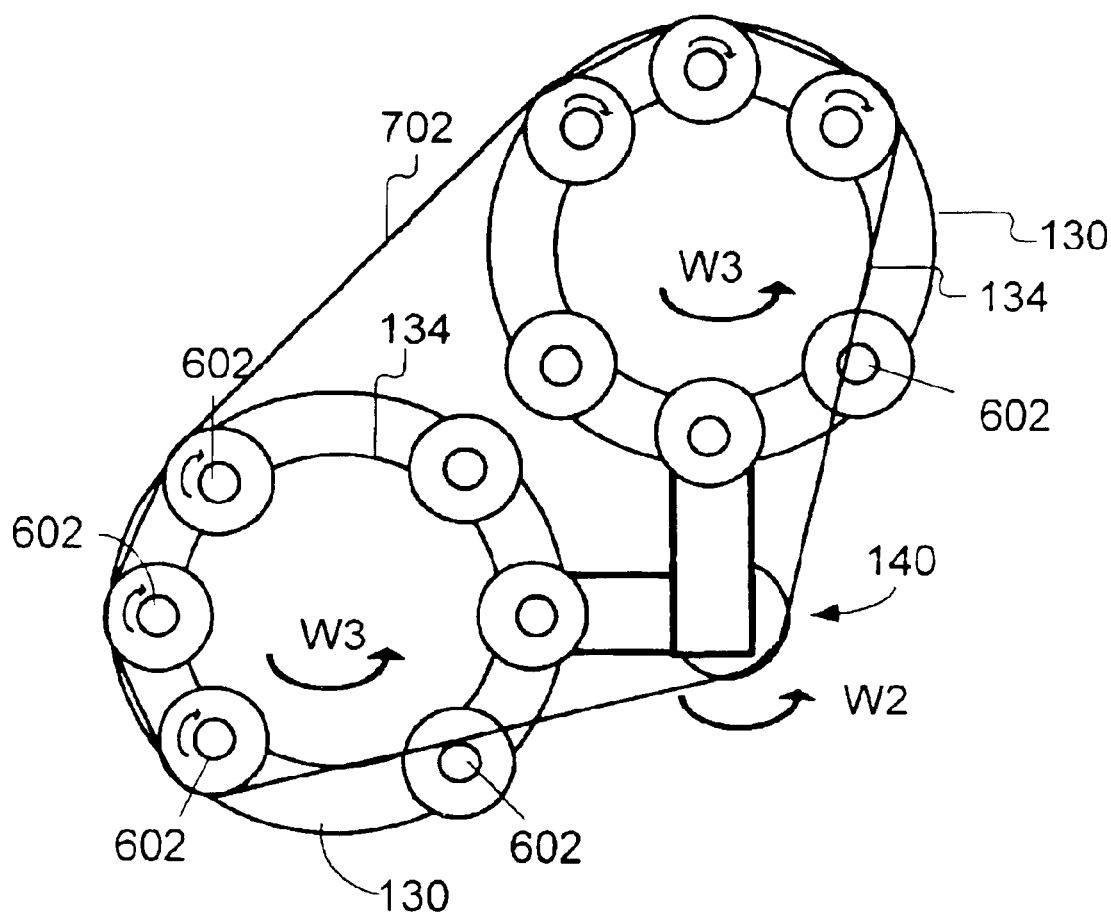
Figure 16:
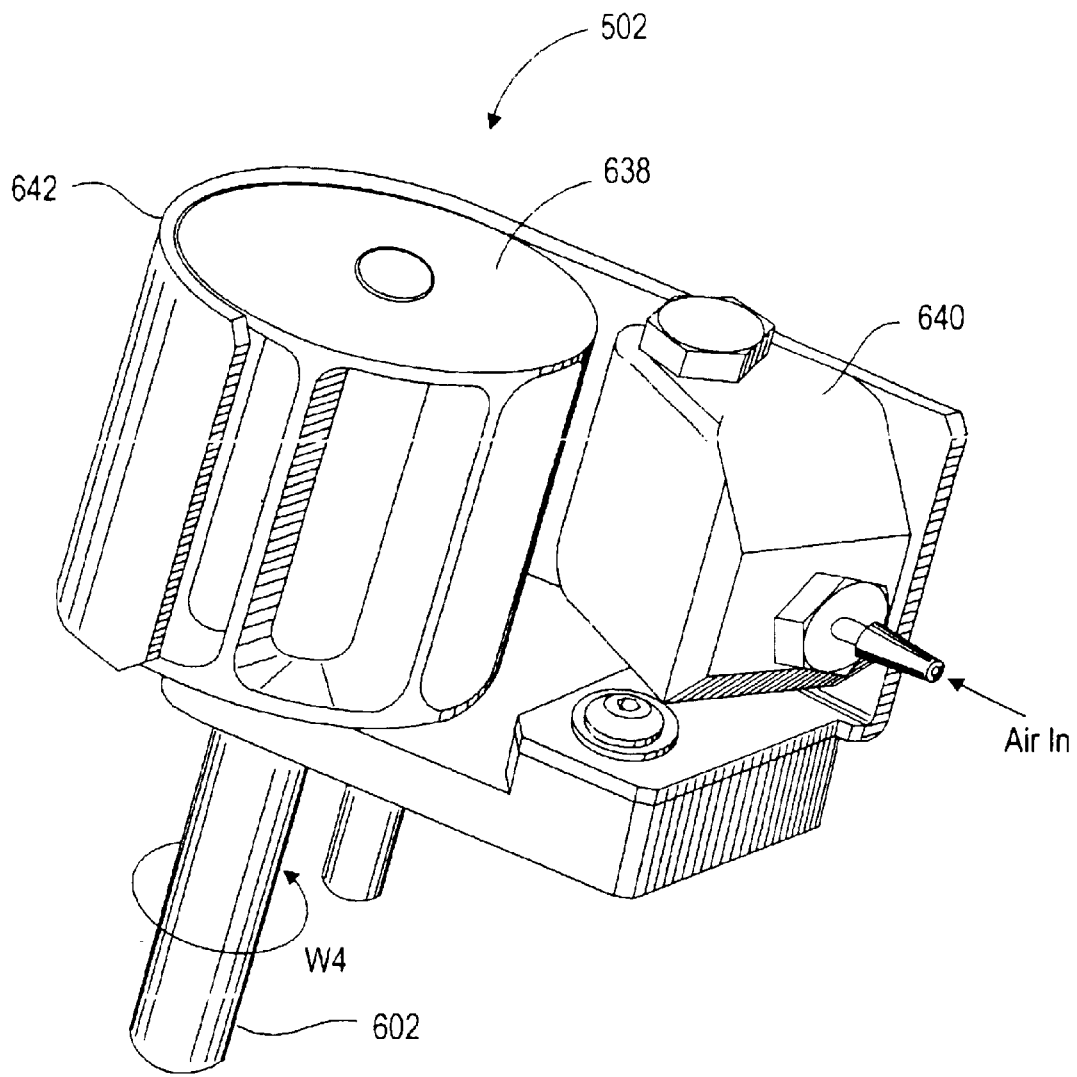
FIG. 16 is a perspective view of an air motor used in a wafer holder of one embodiment of the present invention.

In FIG. 15, a single link 702, e.g. a belt or a chain, drives pins 602 of two wafer holders 130. Other mechanisms (not shown) may be used to drive the pins of other wafer holders that may be present in the system. A single link may drive pins on more than two wafer holders.

The embodiments of FIGS. 5–15, the motion of wafer 134 includes at least three rotational motion components. The first rotational motion (W1) is a rotation around the axis 150X. The system including the arm 150A, the drive 140, and the wafer holders 130 rotates around this axis. The second rotational motion (W2) is provided by the rotation of drive 140 and the wafer holders 130 around the axis 140X. In addition, a rotational mechanism (including, for example, drives 502, limiters 602, mechanisms 702) provides the third rotational motion of the wafer in the wafer holder.

FIG. 17 shows a detailed view of one embodiment of drive 502 (FIG. 11). The drive is actuated by an embodiment of air motor. Shown are a vane impeller 638, a blower 640 and a flow duct 642. Pin 602 is attached concentrically to vane impeller 638. Air from a pressure source is introduced into blower 640 and is emitted through a nozzle (not shown) in blower 640 against one side of van impeller 638. Flow duct 642 guides the air around vane impeller 638, causing van impeller 638 and pin 602 to spin at an angular velocity W4. Since the edge of wafer 134 (FIG. 11) is in contact with pins 602, the wafer 134 also rotates at the angular velocity W3, the relationship between W3 and W4 being governed by the following equation:

$$W4 = W3\left(\frac{Dw}{D_{Pin}}\right)$$

where Dw and $D_{Pin}$ are the diameters of wafer 134 and pin 602, respectively. In one embodiment the air supplied to blowers 640 is from the same pressure source (e.g., 20 psi) that is used to supply the vortex chucks that clamp wafer 134 to holder 130. The nozzles in blowers 640 have an opening 0.020 mm in diameter.

Figure 17B:
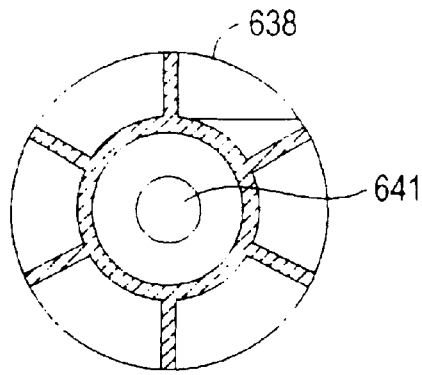
FIGS. 17A and 17B are perspective and cross-sectional views, respectively, of the vane impeller in the air motor of FIG. 16.
Figure 17A:
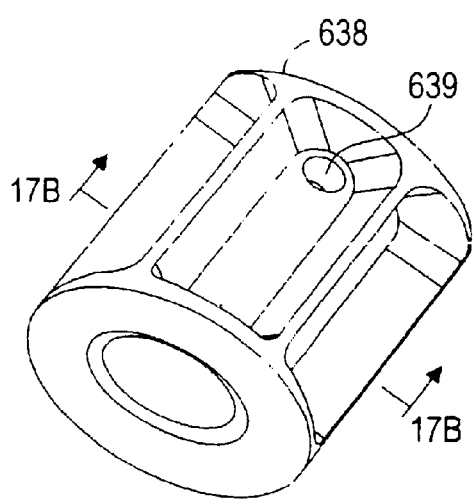

FIGS. 17A and 17B are perspective and cross-sectional views, respectively, of vane impeller 638, FIG. 17B being taken at cross-section 17B—17B shown in FIG. 17A. Pin 602 is mounted in an internal bore 641 of vane impeller 638 by means of a set screw (not shown) that is threaded into tapped hole 639. In one embodiment vane impeller 638 is 1 inch in diameter.

Figure 18:
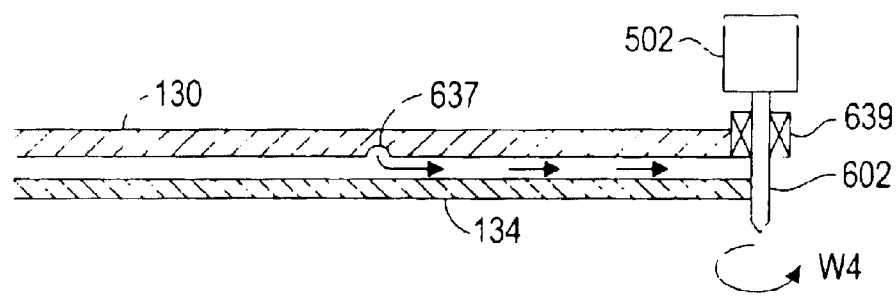
FIG. 18 is a cross-sectional view of the assembly including the wafer holder, air motor, pin and wafer in the system of FIG. 16.

FIG. 18 is a cross-sectional view of the assembly that includes wafer holder 130, pin 602, air motor 502, and wafer 134. As indicated, wafer 134 "floats" below wafer holder 130 by means of vortex chucks, one of which is shown as 637. Pin 602 is mounted in a bearing 639. The arrows show the path of the air leaving the vortex chuck 637.

Figure 19:
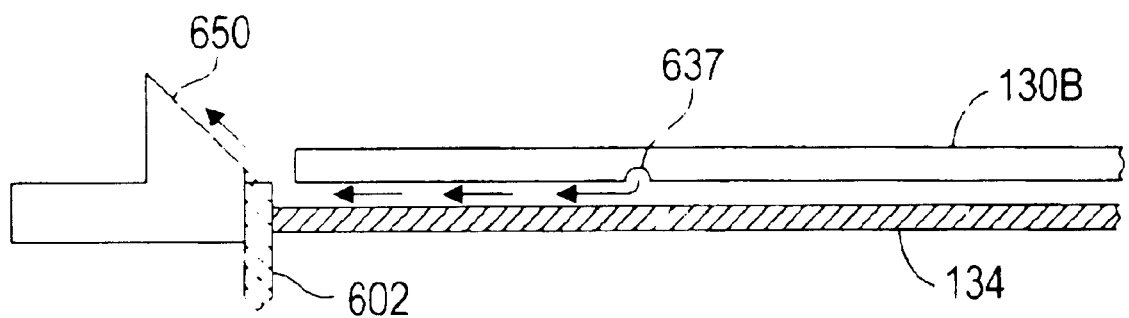
FIG. 19 is a side view illustrating an embodiment wherein the pins are attached to a brim that rotates around the center of the substrate.

FIG. 19 shows a detail of an embodiment of FIG. 6. Pins 602 are rigidly attached to a brim 650 that rotates around wafer holder body 130B. The brim helps obtaining good processing uniformity at the wafer edges. See U.S. patent application Ser. No. 09/457,042, mentioned above, incorporated herein by reference. Another possibility is that the pins 602 could be rotated by a propeller (not shown) driven by the air flow created as arms 140A rotate around axis 140X.

In other embodiments the pins are free to rotate (i.e., mounted in bearings) but are not driven, and the air from the vortex chucks is used to rotate the substrate.

Figure 20:
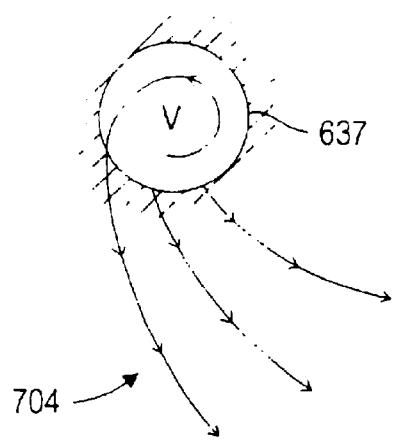
FIG. 20 is a detailed view of a vortex chuck.

FIG. 20 shows a single vortex chuck 637 in detail. The air swirling through the opening creates a vacuum (labeled"V") at the center of the opening. After the air leaves the vortex chuck, it flows outward in a radial pattern 704 sometimes referred to as a "rooster tail".

Figure 21:
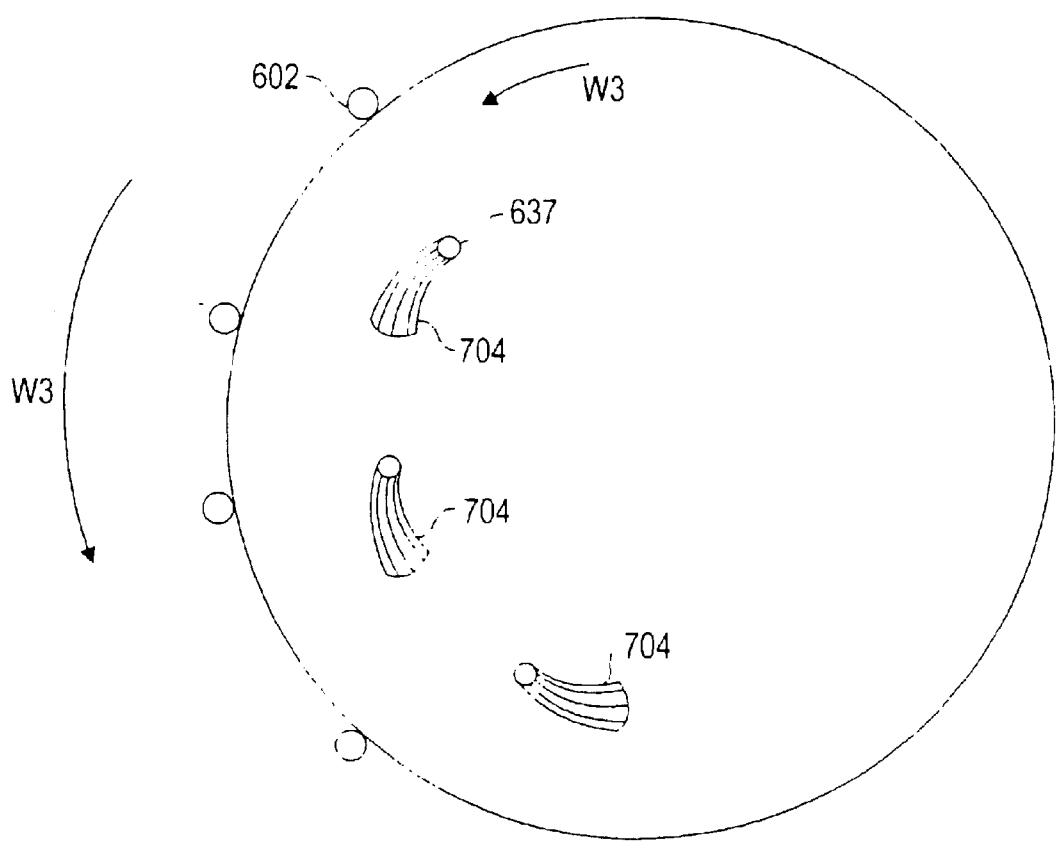
FIG. 21 is a view of several vortex chucks oriented to impart a rotational movement to a wafer.

As shown in FIG. 21, if the "rooster tails" are oriented in a single angular direction around the center of a wafer, a rotational force may be imparted on the wafer. By adjusting the size and number of vortex chucks and the air pressure through them, the wafer can be caused to rotate at a desired angular velocity W3. In this case the pins 602 rotate freely, constraining the wafer in position over the surface of the holder but allowing the water to rotate.

The above embodiments illustrate but do not limit the invention. The invention is not limited by any dimensions, velocity values or relationships between the dimensions and the velocity values. The invention is not limited to systems in which a plasma jet is too narrow to cover the entire wafer. The invention is not limited to the dynamic plasma treatment or to plasma processing at atmospheric pressure, and is applicable to plasma processing in vacuum. Plasma source 114 does not have to be stationary, it may move during wafer processing. Axis 150X may also move. In some embodiments, the wafers are positioned above the holders, and the plasma flows downward. The invention is not limited to semiconductor wafers or to round articles. The invention is applicable to processing of flat screens or other articles, known or to be invented. In some embodiments, a holder 130 holds a semiconductor chip, or a number of chips, obtained from a semiconductor wafer through dicing. Each chip may include circuitry.

The invention is not limited to any particular motors used for the drives 140, 150, 502. Stepper motors, servo motors, or other motors, known or to be invented, may also be applicable. In some embodiments, a single motor drives the arm 150A around the axis 150X and the carrousel 124 around the axis 140X. The invention is defined by the appended claims.

We claim:

1. A method for processing an article with plasma, the method comprising:
   (a) generating the plasma;
   (b) moving the article as the article contacts the plasma, wherein a motion of the article comprises at least a first rotational motion, a second rotational motion, and a third rotational motion which occur simultaneously;
   wherein in the operation (b), the article is held in a non-contact article holder with one or more gas flows emitted from a body of the holder towards the article, the one or more gas flows holding the article adjacent to the body while preventing the article from contacting the body.

2. The method of claim 1 wherein the first rotational motion comprises a rotation of a first system around a first axis;
   wherein the first system comprises a second system, and the second rotational motion comprises a rotation of the second system around a second axis;
   wherein the second system comprises a third system, and the third rotational motion is actuated by rotation of the third system around a third axis.

3. The method of claim 2 wherein the first system comprises a first arm which rotates the second system around the first axis; and
   wherein the second system comprises a second arm which rotates the article around the second axis.

4. The method of claim 2 wherein the third system comprises the article holder, and the third rotational motion of the article is actuated by rotation of the article holder.

5. The method of claim 2 wherein the article has a surface all of which is to be processed with the plasma, but at any time when the plasma contacts the article, a distance between the first axis and a plasma region contacting the article is greater than a distance between the first axis and said surface.

6. The method of claim 1 wherein the third system comprises a rotatable member contacting the article on a side of the article as the article is pressed against the rotatable member by a centrifugal force, and the third rotational motion of the article is transferred to the article from rotation of the member.

7. The method of claim 6 wherein the first rotational motion comprises a rotation of a first system around a first axis;
   wherein the first system comprises a second system, and a second rotational motion comprises a rotation of the second system around a second axis;
   wherein the first system comprises a first body rotating around the first axis but not around the second axis;
   wherein the second system comprises said rotatable member and a link coupled to the rotatable member and the first body, and the coupling between the link and the first body causes the member to induce the third rotational motion of the article.

8. The method of claim 6 wherein the rotatable member is a pin placed at one side of the article.

9. The method of claim 6 wherein the rotatable member comprises a rim surrounding the article.

10. The method of claim 9 wherein the rim has protrusions and/or openings, to allow the gas to escape between the protrusions and/or through the openings.

11. The method of claim 1 wherein the article is a semiconductor chip or wafer.

12. The method of claim 1 wherein the article has a surface all of which is to be processed with the plasma, but at any given time at most a portion of said surface is in contact with the plasma.

13. The method of claim 12 wherein at any given time T1 when the surface is in contact with the plasma, the surface has points moving at different speeds, and the point which has the lowest speed at the time T1 is not contacted by the plasma, but said point is contacted by the plasma at other time when said point is not the point having the lowest speed.

14. The method of claim 1 wherein the third rotational motion comprises a rotation around an axis passing through the article.

15. The method of claim 1 wherein the third rotational motion comprises a rotation around an axis passing through the holder's portion facing the article.

16. The method of claim 1 wherein the plasma is a plasma jet which is too narrow to cover the article, and the article moves in and out of the plasma jet.

17. The method of claim 1 wherein the article processing is performed at atmospheric pressure.

18. The method of claim 1 wherein the article processing is an etch.

19. A method for processing an article with plasma, the method comprising:
(a) generating the plasma;
(b) moving the article as the article contacts the plasma, wherein a motion of the article comprises at least a first rotational motion, a second rotational motion, and a third rotational motion which occur simultaneously;
wherein the first rotational motion comprises a rotation of a first system around a first axis;
wherein the first system comprises a second system, and the second rotational motion comprises a rotation of the second system around a second axis;
wherein the second system comprises a third system, and the third rotational motion is actuated by rotation of the third system around a third axis;
wherein the article has a surface all of which is to be processed with the plasma, but at any time when the plasma contacts the article, said surface's portion closest to the first axis is not in the plasma.

20. The method of claim 19 wherein angular velocities of the first, second and third rotational motions are controlled so that at any time when the plasma contacts the article, said surface's portion closest to the first axis has a lower speed than any other portion of said surface.

21. The method of claim 19 wherein the third axis passes through the article.

22. The method of claim 19 wherein the article is held in an article holder, and the third axis passes through the article holder's portion facing the article.

23. The method of claim 19 wherein the plasma is a plasma jet which is too narrow to cover the article, and the article moves in and out of the plasma jet.

24. The method of claim 19 wherein the article processing is performed at atmospheric pressure.

25. The method of claim 19 wherein the article processing is an etch.

26. The method of claim 19 wherein at any time when the plasma contacts the article, said surface's portion closest to the second axis is not in the plasma.

27. A method for processing an article with plasma, the method comprising:
(a) generating the plasma;
(b) moving the article as the article contacts the plasma, wherein a motion of the article comprises at least a first rotational motion, a second rotational motion, and a third rotational motion which occur simultaneously;
wherein the first rotational motion comprises a rotation of a first system around a first axis;
wherein the first system comprises a second system, and the second rotational motion comprises a rotation of the second system around a second axis;
wherein the second system comprises a third system, and the third rotational motion is actuated by rotation of the third system around a third axis;
wherein the article has a surface all of which is to be processed with the plasma, but at any time when the plasma contacts the article, said surface's portion closest to the second axis is not in the plasma.

28. The method of claim 27 wherein angular velocities of the first, second and third rotational motions are controlled so that at any time when the plasma contacts the article, said surface's portion closest to the second axis has a lower speed than said surface's portion passing through the plasma.

29. The method of claim 27 wherein the third axis passes through the article.

30. The method of claim 27 wherein the article is held in an article holder, and the third axis passes through the article holder's portion receiving the article.

31. The method of claim 27 wherein the plasma is a plasma jet which is too narrow to cover the article, and the article moves in and out of the plasma jet.

32. The method of claim 27 wherein the article processing is performed at atmospheric pressure.

33. The method of claim 27 wherein the article processing is an etch.

34. A method for processing an article with plasma, the method comprising:
(a) generating the plasma;
(b) moving the article as the article contacts the plasma, wherein a motion of the article comprises at least a first rotational motion, a second rotational motion, and a third rotational motion which occur simultaneously;
wherein the first rotational motion comprises a rotation of a first system around a first axis;
wherein the first system comprises a second system, and the second rotational motion comprises a rotation of the second system around a second axis;
wherein the second system comprises a third system, and the third rotational motion is actuated by rotation of the third system around a third axis;
wherein the article has a surface all of which is to be processed with the plasma, but at any time when the plasma contacts the article, only a portion of said surface is in contact with the plasma;
wherein angular velocities of the first, second and third rotational motions are controlled so that when said surface is in contact with the plasma, said surface has points moving at different speeds, and the point which has the lowest speed is not contacted by the plasma.

35. The method of claim 34 wherein the third axis passes through the article.

36. The method of claim 34 wherein the article is held in an article holder, and the third axis passes through the article holder's portion receiving the article.

37. The method of claim 34 wherein the plasma is a plasma jet which is too narrow to cover the article, and the article moves in and out of the plasma jet.

38. The method of claim 34 wherein the article processing is performed at atmospheric pressure.

39. The method of claim 34 wherein the article processing is an etch.

\* \* \* \* \*